United States Patent
Bauman et al.

(10) Patent No.: US 12,322,928 B2
(45) Date of Patent: Jun. 3, 2025

(54) OPTICAL DEVICE INCLUDING LATERALLY GUIDED VERTICAL-CAVITY SURFACE-EMITTING LASERS (VCSELs) OUTPUTS AND RELATED METHODS

(71) Applicant: EAGLE TECHNOLOGY, LLC, Melbourne, FL (US)

(72) Inventors: Stephen J. Bauman, Palm Bay, FL (US); Fraser R. Dalgleish, Vero Beach, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 944 days.

(21) Appl. No.: 17/466,576

(22) Filed: Sep. 3, 2021

(65) Prior Publication Data

US 2023/0073094 A1    Mar. 9, 2023

(51) Int. Cl.
G02B 6/43      (2006.01)
H01S 5/026     (2006.01)
H01S 5/42      (2006.01)

(52) U.S. Cl.
CPC ............... H01S 5/423 (2013.01); G02B 6/43 (2013.01); H01S 5/026 (2013.01)

(58) Field of Classification Search
CPC ............ H01S 5/423; H01S 5/026; G02B 6/43
See application file for complete search history.

(56) References Cited

U.S. PATENT DOCUMENTS

| 4,829,597 A | 5/1989 | Gelbwachs |
| 5,181,135 A | 1/1993 | Keeler |
| 5,784,339 A | 7/1998 | Woodsum et al. |
| 6,680,788 B1 | 1/2004 | Roberson |
| 7,544,945 B2 | 6/2009 | Tan et al. |
| 7,953,326 B2 | 5/2011 | Farr et al. |
| 8,045,859 B2 | 10/2011 | Bandyopadhyay |
| 8,301,027 B2 | 10/2012 | Shaw et al. |
| 8,615,028 B1 | 12/2013 | Sayyah |
| 9,203,524 B2 | 12/2015 | Simpson et al. |
| 9,490,910 B2 | 11/2016 | Lacovara |

(Continued)

FOREIGN PATENT DOCUMENTS

| EP | 3575824 | 12/2019 |
| JP | 2009300562 | 12/2009 |

(Continued)

OTHER PUBLICATIONS spiedigitallibrary.org/ebooks, Introduction to Integrated Optical Modulators, Ch. 3 dated Aug. 17, 2021.

(Continued)

*Primary Examiner* — Sung H Pak

(74) *Attorney, Agent, or Firm* — ALLEN, DYER, DOPPELT, + GILCHRIST, P.A.

(57) ABSTRACT

An optical device may include a substrate and vertical-cavity surface-emitting lasers (VCSELs) on the substrate. The optical device may also include a coupling layer over the substrate and that includes optical guides aligned with the VCSELs to guide outputs thereof from a vertical path direction to a lateral path direction. The optical device also includes controllable delay elements, each controllable delay element associated with a respective optical guide, and a controller coupled to the controllable delay elements.

25 Claims, 4 Drawing Sheets

(56) References Cited

U.S. PATENT DOCUMENTS

| | | | |
|---|---|---|---|
| 9,490,911 | B2 | 11/2016 | Hopewell et al. |
| 9,647,771 | B2 | 5/2017 | Neuner, III et al. |
| 9,873,495 | B2 | 1/2018 | Stone et al. |
| 2015/0205062 | A1* | 7/2015 | Collins .................. G02B 6/34 385/14 |
| 2017/0268988 | A1 | 9/2017 | Swanson |
| 2019/0004394 | A1 | 1/2019 | Shin et al. |
| 2019/0369213 | A1* | 12/2019 | Jenkins ................. G01S 7/4817 |
| 2019/0393680 | A1 | 12/2019 | Tatum et al. |
| 2020/0150240 | A1 | 5/2020 | Huwer et al. |
| 2021/0063842 | A1 | 3/2021 | Byun et al. |

FOREIGN PATENT DOCUMENTS

| | | |
|---|---|---|
| JP | 2013504212 | 2/2013 |
| WO | 2002089272 | 11/2002 |

OTHER PUBLICATIONS

Claudio Porzi et al., Photonic Integrated Microwave Phase Shifter up to the mm-Wave Band with Fast Response Time in Silicon-on-Insulator Technology; Journal of Lightweight Technology, vol. 36, No. 19 dated Oct. 1, 2018.

Koen Alexander et al., Nanophotonic Pockels Modulators on a Silicon Nitride Platform; Nature Communications Article dated 2018.

Porcel et al., Optics and Laser Technology—Silicon Nitride Photonic Integration for Visible Light Applications; www.elsevier.com dated Nov. 28, 2018.

Robert Morgan et al., GaN Vertical Cavity Surface Emitting Lasers (VCSELs), Technology Readiness Overview; 2020.

Daniel Blumenthal, Photonic Integration for UV to IR Applications, APL Photonics, accepted Jan. 8, 2020.

Pascual Munoz, Silicon Nitride Photonic Integration Platforms for Visible, Near-infrared and Mid-infrared Applications, Sensors, 17, 2088 (2017).

Tsung-Ju Lu et al., Aluminum Nitride Integrated Photonics Platform for the Ultraviolet to Visible Spectrum, Optics Express 26, No. 9 dated Apr. 30, 2018.

Liu et al., Aluminum nitride-on-sapphire platform for integrated high-Q microresonators, Optics Express 25, No. 2 dated Jan. 23, 2017.

Sun et al., Vertical chip-to-chip coupling between silicon photonic integrated circuits using cantilever couplers; Optical Express, vol. 19, No. 5 dated Feb. 28, 2011.

Ong et al., SiN x bilayer grating coupler for photonic systems; OSA Publishing, vol. 1, No. 1 dated Sep. 15, 2018.

Rusing et al., Toward 3D integrated photonics including lithium niobite thin films; IEEE Nanotechnology Magazine, 1932-4510 dated Aug. 2019.

Arefin et al., III-N/Si3N4 Integrated photonics platform for blue wavelengths; IEEE Journal of Quantum Electronics, 56, No. 4 dated Aug. 2020.

Johnson et al., High-speed beam steering with phased vertical cavity laser arrays; IEEE Journal of Selected Topics in Quantum Electronics 19, No. 4 dated Jul./Aug. 2013.

Xun, Beam steering analysis in optically phased vertical cavity surface emitting laser array, Chinese Physics Letters, vol. 35, p. 5 published 2018.

G. Pan; G. Pan et al., In-Phased Implant-Defined Hexagonal VCSEL Array With Near-Diffraction-Limited Beam, in IEEE Photonics Technology Letters, vol. 31, No. 20, pp. 1647-1649, 15 Oct. 15, 2019.

Warren et al., On-axis far-field emission from two-dimensional phase-locked vertical cavity surface-emitting laser arrays with an integrated phase-corrector, Appl. Phys. Lett. 61, published Jun. 4, 1998.

Sayyah et al., "Two-dimensional pseudo-random optical phased array based on tandem optical injection locking of vertical cavity surface emitting lasers," Optics Express vol. 23, No. 15 dated Jul. 27, 2015.

Xun et al., Stable in-phase mode operation in coherent VCSEL array with an integrated phase shifter, IEEE Trans. on Electron Devices, vol. 67, No. 7 dated Jul. 2020.

\* cited by examiner

OPTICAL DEVICE INCLUDING LATERALLY GUIDED VERTICAL-CAVITY SURFACE-EMITTING LASERS (VCSELs) OUTPUTS AND RELATED METHODS

FIELD OF THE INVENTION

The present invention relates to the field of electronics, and, more particularly, to optical devices including vertical-cavity surface-emitting lasers and related methods.

BACKGROUND OF THE INVENTION

A communications network is a group of nodes interconnected by links that are used to exchange messages between the nodes. The links may use a variety of technologies based on the methodologies of circuit switching, message switching, or packet switching, to pass messages and signals.

One type of network is an underwater network whereby communications are performed underwater. Most underwater networks provide underwater communication via tethered copper cables, for example, via specialized underwater optical fiber cables, or via acoustic modems.

U.S. Pat. No. 9,647,771 to Neuner, III et al. is directed to a system for wavelength optimization for underwater optical communication. The system includes lasers having different wavelengths, a beam splitter, and a corner retro-reflector. The lasers can simultaneously illuminate the beam splitter along a coincident axis. The lasers can be selectively blocked so that only one laser wavelength at a time impinges on the beam splitter. A portion passes through the beam splitter to establish a reference signal, while the remainder is reflected off the corner retro-reflector. A portion of return illumination passes through the beam splitter to establish a return signal. The process can be repeated for each of lasers. The wavelength where the normalized signal-to-noise differential between the reference signal and return signal is the minimum can be the optimum communication wavelength.

SUMMARY OF THE INVENTION

An optical device may include a substrate and a plurality of vertical-cavity surface-emitting lasers (VCSELs) on the substrate. The optical device may also include a coupling layer over the substrate and comprising a plurality of optical guides aligned with the plurality of VCSELs to guide outputs thereof from a vertical path direction to a lateral path direction. The optical device may further include a plurality of controllable delay elements, each controllable delay element associated with a respective optical guide. A controller may be coupled to the plurality of controllable delay elements.

Each controllable delay element may be associated with the lateral path direction of the respective optical guide, for example. Each optical guide may include an optical waveguide having a bend therein.

Each optical guide may include at least one of an optical mirror and an optical grating, for example. The optical device may include a plurality of re-emission elements on the substrate downstream from the plurality of controllable delay elements, each re-emission element associated with a respective optical guide.

The controller may be configured to control the plurality of controllable delay elements to shape an output beamwidth for the plurality of VCSELs, for example. The controller may be configured to control the plurality of controllable delay elements to steer an output beam for the plurality of VCSELs.

The controller may be configured to modulate the plurality of VCSELs for data transmission, for example. The optical device may include a plurality of optical detectors on the substrate, for example.

The optical device may include a plurality of phase correction elements, each phase correction element associated with a respective optical guide. The plurality of VCSELs may include at least some VCSELs operating at different wavelengths. The plurality of VCSELs may be operable at a wavelength in a range of 390 nm to 510 nm, for example.

A method aspect is directed to a method for making an optical device. The method may include forming a plurality of vertical-cavity surface-emitting lasers (VCSELs) on a substrate, and positioning a coupling layer over the substrate and comprising a plurality of optical guides aligned with the plurality of VCSELs to guide outputs thereof from a vertical path direction to a lateral path direction. The method may further include forming a plurality of controllable delay elements, each controllable delay element associated with a respective optical guide, and coupling a controller to the plurality of controllable delay elements.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in alternative embodiments.

Figure 1:
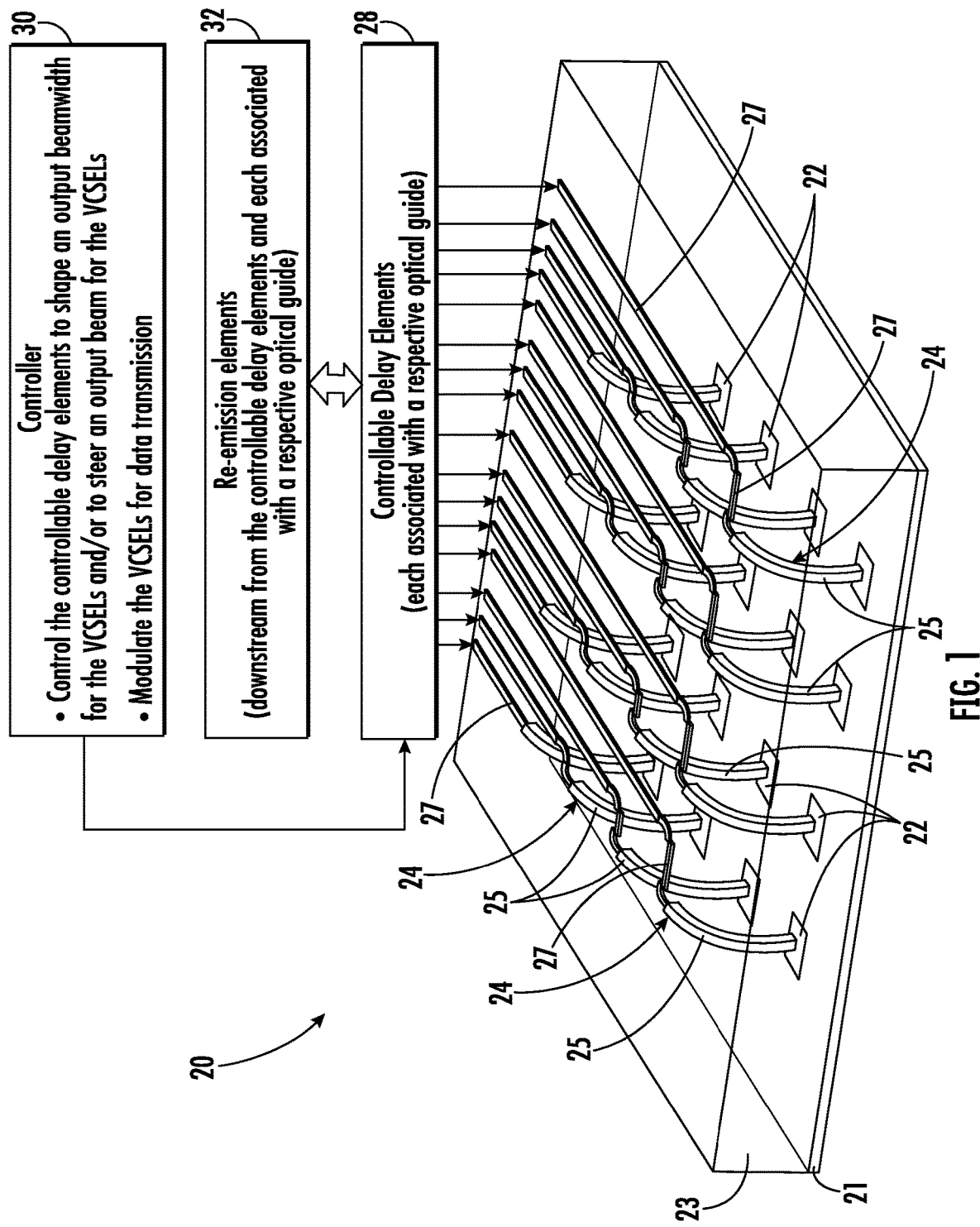
FIG. 1 is a schematic diagram of an optical device in accordance with an embodiment.

Referring initially to FIG. 1, an optical device 20 illustratively includes a substrate 21 and an array of spaced apart vertical-cavity surface-emitting lasers (VCSELs) 22 on the substrate. The VCSELs 22 may be operable at a wavelength in the range of 390 nm to 510 nm, for example, which corresponds to the ultraviolet blue/green range. The VCSELs 22 may be gallium nitride (GaN) VCSELs, for example. The wavelength may be suitable for communications underwater, for example, as will be appreciated by those skilled in the art.

A coupling layer 23 is over the substrate 21. The coupling layer 23 may include a dielectric material, such as nitride material (e.g., GaN, silicon nitride (SiN), aluminum nitride (AlN)). The coupling layer 23 includes optical guides, illustratively in the form of optical waveguides 24, aligned with the VCSELs to guide outputs thereof from a vertical path direction to a lateral path direction. More particularly, each optical waveguide 24 includes a vertical optical waveguide portion 25 having a bend therein. The vertical optical waveguide portion 25 is coupled between the corresponding VCSEL 22 and a corresponding lateral optical waveguide portion 27 that extends laterally from the vertical optical waveguide portion 25.

The lateral waveguide portions 27 may also include transitions to provide respective lateral offsets to establish a spacing between parallel adjacent lateral waveguide portions. In other words, the lateral optical waveguide portions 27 may have bends therein to permit the lateral optical waveguides to extend upstream for coupling to other components. The lateral optical waveguides 27 may include or be in the form of a blue-light waveguides, for example, along the lateral path.

The optical device 20 also includes controllable delay elements 28. Each controllable delay element 28 is associated with a respective optical waveguide 24. The controllable delay elements 28 may each be controllable phase delay elements, for example. Of course, the controllable delay elements 28 may be or include other types of programmable delay elements. For example, the controllable delay elements 28 may be based upon resistive heaters to control optical delay as will be appreciated by those skilled in the art. Other controllable delay elements 28 may also be used.

Re-emission elements 32 are on the substrate 21. The re-emission elements 32 are downstream from the controllable delay elements 28. Each re-emission element 32 is associated with a respective optical guide 24. The re-emission elements 32 are used to direct the light in a direction outward from the coupling layer 23, and these may comprise a grating, lens, mirror and/or other optical element as will be appreciated by those skilled in the art.

A controller 30 is coupled to the controllable delay elements 28. The controller 30 is configured to control controllable delay elements 28 to shape an output beamwidth for the array of VCSELs 22. The controller 30 may alternatively or additionally control the controllable delay elements 28 to steer an output beam from the VCSELs 22. The controller 30 may also be configured to modulate the VCSELs 22 for data transmission, as will be appreciated by those skilled in the art.

Figure 2:
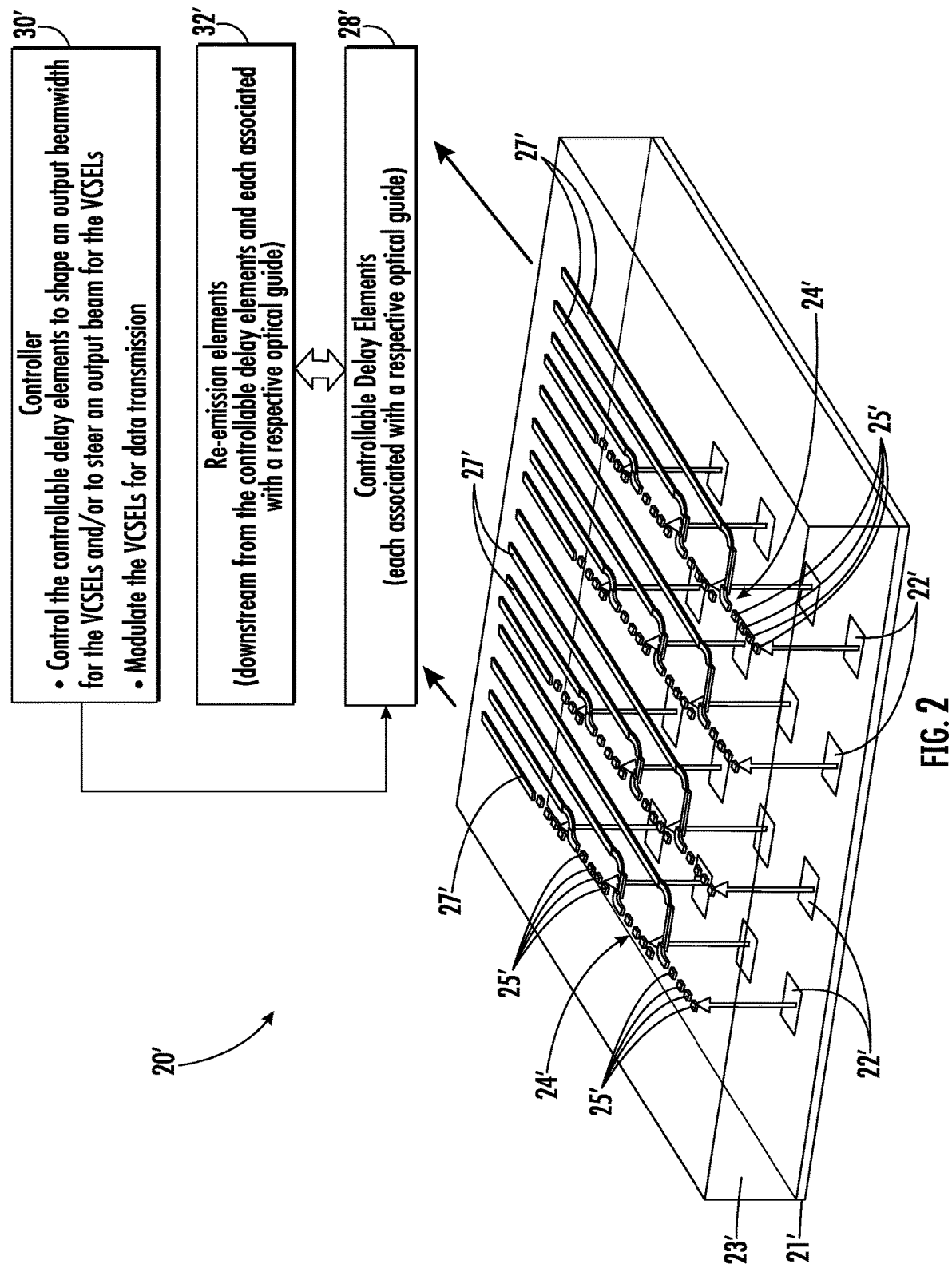
FIG. 2 is a schematic diagram of another optical device in accordance with another embodiment.

Referring now additionally to FIG. 2, in another embodiment of the optical device 20', the optical waveguides 24' may each include an optical grating 25' or vertical grating coupler instead of a bent waveguide portion. The optical grating 25' may be fabricated in the coupling layer 23' over the substrate 21' or, more particularly, formed in the blue-light compatible nitride material (e.g., GaN, SiN, or AlN). The optical grating 25' is coupled between respective VCSELs 22' and horizontal or lateral optical waveguides 27'. In some embodiments, one or more optical mirrors may be used in place of or in combination with the optical gratings 25', for example.

Similar to the embodiment described above, the controllable delay elements 28' are coupled to the optical waveguides 24' and more particularly, the lateral optical waveguides 27', and the re-emission elements 32' are coupled to the controllable delay elements. The controller 30' is also coupled to the programmable delay elements 28'. The functions and operations of the controllable delay elements 28', the re-emission elements 32', and the controller 30' are similar to those described above.

Figure 3:
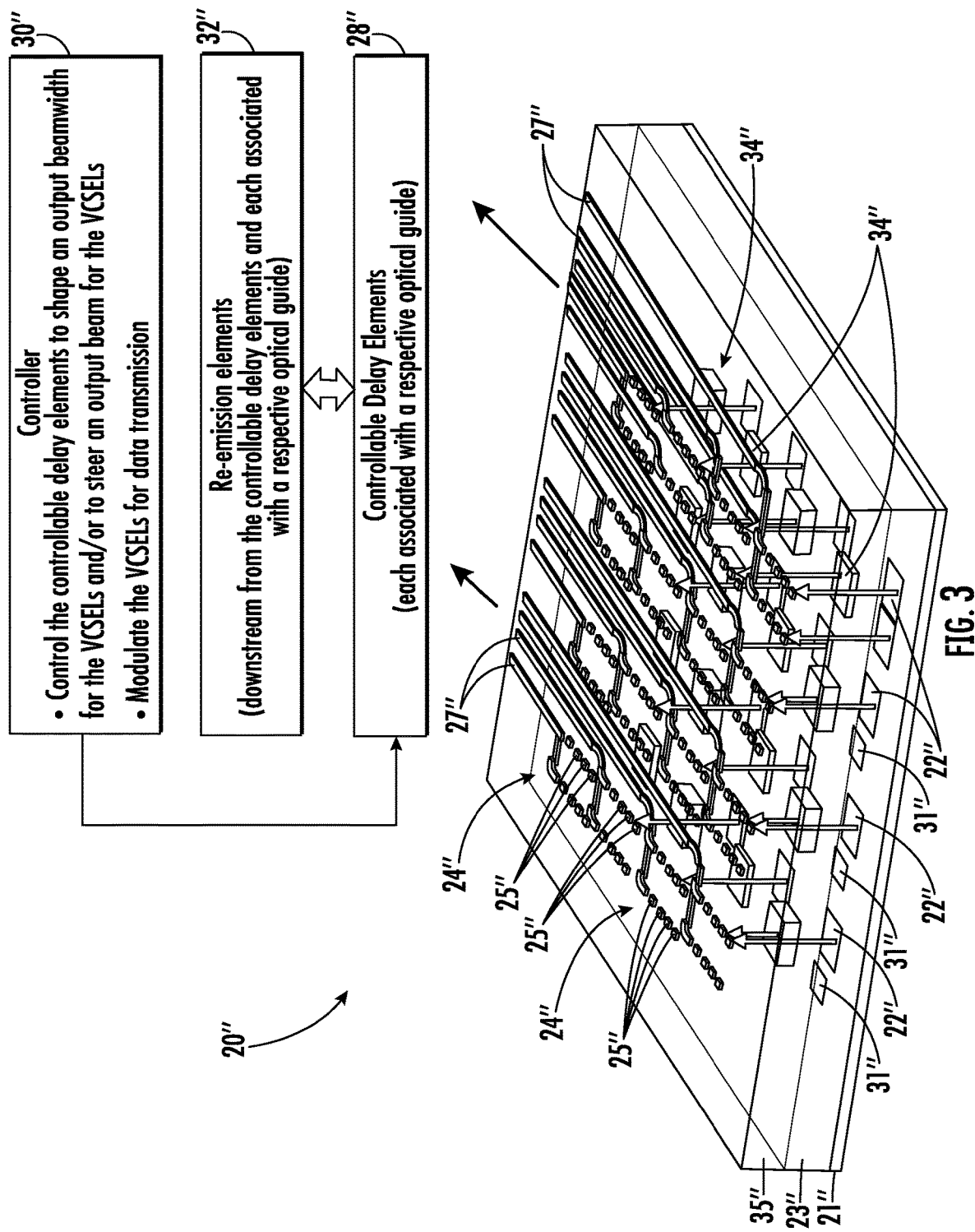
FIG. 3 is a schematic diagram of another optical device in accordance with another embodiment.

Referring now to FIG. 3, optical detectors 31", for example, photodetector elements, may, in addition to the VCSELs 22", be carried by the substrate 21" below the coupling layer 23". Additionally, phase correction elements 34" may be included within the upper coupling layer portion 35". Each phase correction element 34" may be associated with a respective optical guide 24". The phase correction elements 34" may provide fixed phase delay corrections, for example. The optical guides 24" illustratively each include an optical grating 25".

Similar to the embodiment described above, the controllable delay elements 28" are coupled to the lateral optical waveguides 27" and the re-emission elements 32" are coupled to the controllable delay elements for the transmit direction. Optical collection elements, not shown, are provided at the ends of the optical guides for the receive direction. The controller 30" is also coupled to the programmable delay elements 28". The functions and operations of the controllable delay elements 28", the re-emission elements 32" and collection elements, and the controller 30" are similar to those described above.

Figure 4:
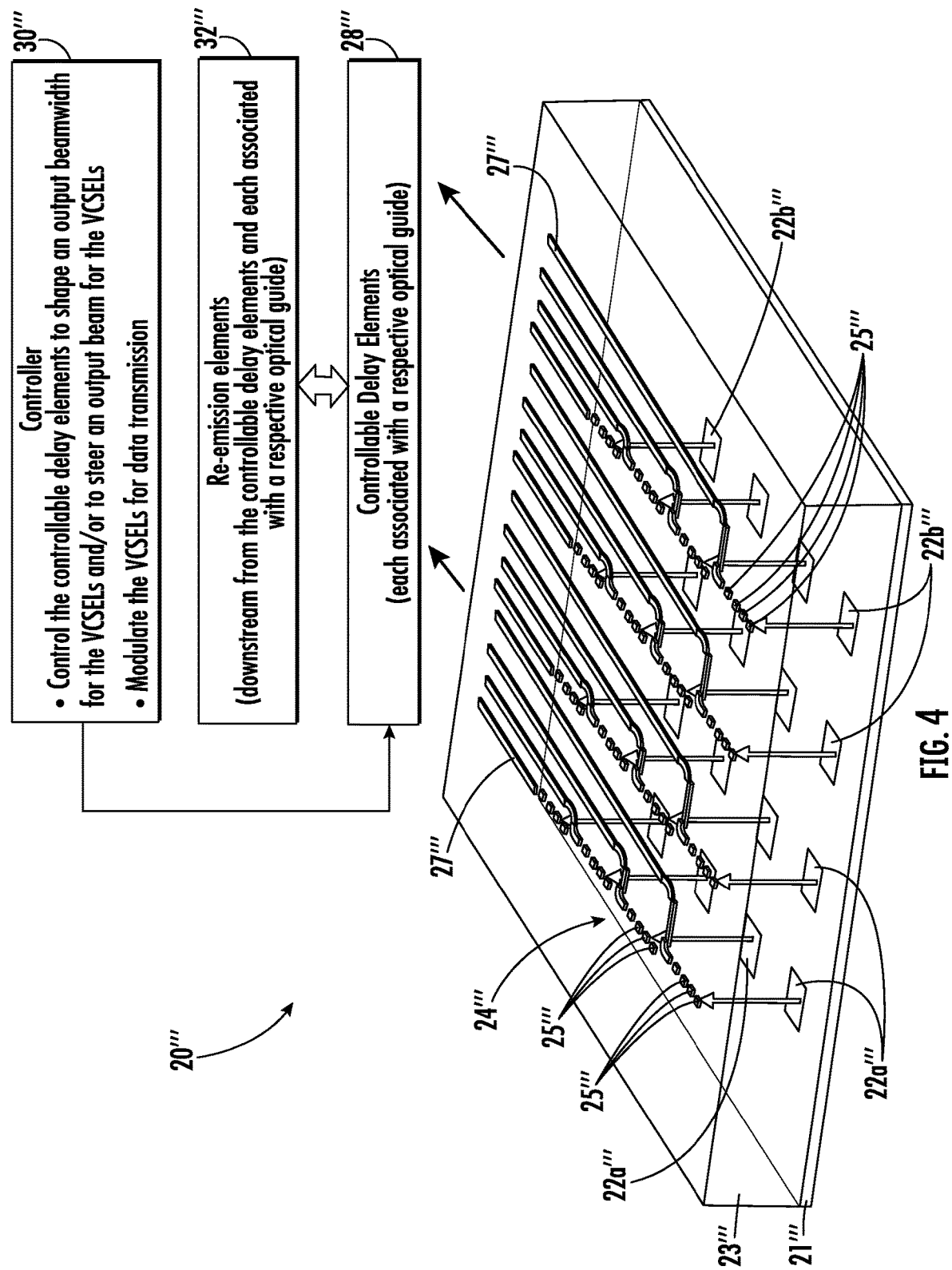
FIG. 4 is a schematic diagram of another optical device in accordance with another embodiment.

Referring now to FIG. 4, in another embodiment, the array of VCSELs 22''' carried on the substrate 21''' operate at different wavelengths, such as to provide multiple communications channels operable at different wavelengths. More particularly, first VCSELs 22a''' operate at a first wavelength and second VCSELs 22b''' operate at a second wavelength different that the first wavelength. The use of first and second VCSELs 22a''', 22b''' makes use of subarrays of tailored VCSEL elements that lase at different wavelengths, within the larger overall array of VCSELs. The different wavelengths may be set by different cavity dimensions as will be appreciated by those skilled in the art.

Similar to embodiments described above, the optical waveguides 24" illustratively each include an optical grating 25" coupled to each of the first and second VCSELs 22a''', 22b'''. Of course, the vertical couplers with the bend therein may be used or a combination of vertical waveguide couplers and optical gratings 25" may be used.

Also similar to embodiments described above, the controllable delay elements 28''' are coupled to the optical waveguides 24''' and more particularly, the lateral optical waveguides 27''', and the re-emission elements 32" are coupled to the controllable delay elements. The controller 30''' is also coupled to the programmable delay elements 28'''. The functions and operations of the controllable delay elements 28''', the re-emission elements 32''', and the controller 30''' are similar to those described above. Thus, multiple beams may enable multi-beam, multi-wavelength, phased array steering for both transit and receive modes, as will be appreciated by those skilled in the art.

As will be appreciated by those skilled in the art, the optical device may be particularly useful for providing a real-time underwater wireless network on a chip or integrated circuitry. With respect to underwater communications, relatively robust, covert, high bandwidth underwater communication links over distances greater than 500 m are desirable for inter-connecting underwater and surface devices. Practical long range links may generally be highly susceptible to fading and poor bit error rate (BER), and thus may be undesirable. For underwater communications, it may be desirable that non-tethered approach be capable of operating between a wide variety of autonomous underwater vehicles (AUVs) separated by distances of 10 m-100 m. To achieve this, relatively high average power is used to overcome extinction and achieve multimegabit data rates, still limited at 10 m-100 m depending on water conditions, for example. Relatively high average power, however, may not be covert at night, which may increase the size, weight, and power (and cost) per unit.

Also, a relatively high power demand may reduce operational or mission duration, and may thus reduce the mean time between failures. Still further, point-to-point links may be limited in highly variable terrain or a cluttered water column, for example.

Maintaining a free space optical communication (FSOC) link between two moving platforms may thus be challenging, as it typically requires a relatively high-speed and agile acquisition, tracking, and pointing (ATP) subsystem. Existing or prior art gimballed systems are relatively bulky, have many moving parts, and may be limited in tracking speed, for example. Additionally, such ATP systems used in underwater communications between platforms require the use of visible light in the blue-green part of the spectrum due to the significant absorption of shorter and longer wavelengths in water.

With respect to underwater communications, nearly all high bandwidth underwater communications are via tethered copper cable, highly specialized underwater optical fiber cables, or via acoustic modems, for example. Acoustic modems have relatively high latencies, low bandwidth (1-10 Kbps), and are hindered by acoustic multipath effects. Free space laser communication between two nodes at relatively high speeds (1 Mbps-1 Gbps) has been demonstrated. However, point-to-point links using relatively high size, weight, and power plus cost units may be limited to 10-300 m which is not practical for most underwater operations. Thus, underwater communications typically rely on high-powered lasers, sophisticated pointing and tracking optical components, etc. Lower cost optical phased arrays in silicon may generally permit point-to-point communications in air, but may not be effective for underwater communications.

The optical devices described herein may be particularly useful for addressing the above-noted problems with underwater communications. More particularly, the optical devices described herein may be advantageous to enable effective underwater networking between multiple unmanned underwater vehicles (UUVs), for example. The optical devices are associated with a relatively low size, weight, and power, plus cost as the optical device include no moving parts within the optical phased array transmitter, receiver, transceiver designs (e.g., photonic integrated circuit with narrow spectral bandwidth high speed detector array). The optical devices thus permit simultaneous transmit/receive capabilities from multiple individually steerable beams, for example, each having a different UV-blue/green wavelength. This in turn may be used to create a high-speed network across relatively large underwater volumes without tethering.

While the optical devices described herein may be particularly useful for underwater operations, those skilled in the art will appreciate that the optical devices may be useful for other types of environments, for example, outer space and/or terrestrial, for example. For example, with respect to the transceiver embodiment (i.e., VCSELs 22″ and optical detectors 31″ (FIG. 3)), one implementation may be an undersea laser mesh network that includes transceiver nodes (i.e., spaced optical devices 20″) both mobile and moored to the seafloor, for example.

Moreover, using the embodiments of the optical device described herein, node-to-node, node-to-multi-node, multi-node-to-multi-node configurations are possible. As will be appreciated by those skilled in the art, low cross-correlation encrypted code division multiple access (CDMA) schemes may be used to alleviate the needs for precise timing synchronization. Time division multiple access (TDMA) schemes may also be used.

Moreover, mobile nodes including the embodiments of the optical devices described herein can rapidly reconfigure to form linear multi-hop networks to enable relatively low latency, high bandwidth, long distance links for data exfiltration, or can reconfigure into a distributed antenna morphology for mission objectives such as detection of weak and intermittent signals, for example. Additionally, transceivers on a mobile network of nodes may serve as routers, where data packets can be buffered during link outage. Real-time data compression/encryption on the physical layer may also be desirable based upon optical devices described herein.

The optical devices described herein may also permit adaptive laser modulation and link control models for variable coastal water conditions. Application-aware and disruption tolerant end-to-end delivery protocols for multi-hop and mesh mobile underwater laser networks may also be implemented using the optical devices.

A method aspect is directed to a method for making an optical device 20. The method includes forming a plurality of vertical-cavity surface-emitting lasers (VCSELs) 22 on a substrate 21, and positioning a coupling layer 23 over the substrate 21 and comprising a plurality of optical guides, such as in the form of optical waveguides 24, aligned with the plurality of VCSELs 22 to guide outputs thereof from a vertical path direction to a lateral path direction. The method further includes forming a plurality of controllable delay elements 28, each controllable delay element 28 associated with a respective optical guide 24, and coupling a controller to the plurality of controllable delay elements 28.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An optical device comprising:
 a substrate and a plurality of vertical-cavity surface-emitting lasers (VCSELs) on the substrate;
 a coupling layer over the substrate and comprising a plurality of optical guides aligned with the plurality of VCSELS to guide outputs thereof from a vertical path direction to a lateral path direction, each optical guide comprising a vertical portion having a bend therein and a lateral portion extending from the bend so that lateral portions of the plurality of optical guides are parallel;
 a plurality of controllable delay elements, each controllable delay element associated with a respective optical guide; and
 a controller coupled to the plurality of controllable delay elements.

2. The optical device of claim 1 wherein each controllable delay element is associated with the lateral path direction of the respective optical guide.

3. The optical device of claim 1 wherein each optical guide comprises at least one of an optical mirror and an optical grating.

4. The optical device of claim 1 comprising a plurality of re-emission elements on the substrate downstream from the plurality of controllable delay elements, each re-emission element associated with a respective optical guide.

5. The optical device of claim 1 wherein the controller is configured to control the plurality of controllable delay elements to shape an output beamwidth for the plurality of VCSELS.

6. The optical device of claim 1 wherein the controller is configured to control the plurality of controllable delay elements to steer an output beam for the plurality of VCSELS.

7. The optical device of claim 1 wherein the controller is configured to modulate the plurality of VCSELS for data transmission.

8. The optical device of claim 1 comprising a plurality of optical detectors on the substrate.

9. The optical device of claim 1 comprising a plurality of phase correction elements, each phase correction element associated with a respective optical guide.

10. The optical device of claim 1 wherein the plurality of VCSELs comprises at least some VCSELs operating at different wavelengths.

11. The optical device of claim 1 wherein the plurality of VCSELs are operable at a wavelength in a range of 390 nm to 510 nm.

12. An optical device comprising:
    a substrate and a plurality of vertical-cavity surface-emitting lasers (VCSELs) on the substrate;
    a plurality of optical detectors on the substrate;
    a coupling layer over the substrate and comprising
        a plurality of first optical guides aligned with the plurality of VCSELs to guide outputs thereof from a vertical path direction to a lateral path direction, and
        a plurality of second optical guides aligned with the plurality of optical detectors to guide inputs thereto from a horizontal path direction to a vertical path direction;
    a plurality of first controllable delay elements, each first controllable delay element associated with a respective first optical guide;
    a plurality of second controllable delay elements, each second controllable delay element associated with a respective second optical guide; and
    a controller coupled to the plurality of first controllable delay elements and the plurality of second controllable delay elements.

13. The optical device of claim 12 wherein each first controllable delay element is associated with the lateral path direction of the respective first optical guide; and wherein each second controllable delay element is associated with the lateral path direction of the respective second optical guide.

14. The optical device of claim 12 wherein each first optical guide comprises an optical waveguide having a bend therein; and wherein each second optical guide comprises an optical waveguide having a bend therein.

15. The optical device of claim 12 wherein each first optical guide comprises at least one of an optical mirror and an optical grating; and wherein each second optical guide comprises at least one of an optical mirror and an optical grating.

16. The optical device of claim 12 comprising a plurality of re-emission elements on the substrate downstream from the plurality of controllable delay elements, each re-emission element associated with a respective first optical guide.

17. The optical device of claim 12 wherein the controller is configured to control the plurality of first controllable delay elements to shape an output beamwidth for the plurality of VCSELS.

18. The optical device of claim 12 wherein the controller is configured to control the plurality of first controllable delay elements to steer an output beam for the plurality of VCSELS.

19. A method for making an optical device comprising:
    forming a plurality of vertical-cavity surface-emitting lasers (VCSELs) on a substrate;
    positioning a coupling layer over the substrate and comprising a plurality of optical guides aligned with the plurality of VCSELs to guide outputs thereof from a vertical path direction to a lateral path direction, each optical guide comprising a vertical portion having a bend therein and a lateral portion extending from the bend so that lateral portions of the plurality of optical guides are parallel;
    forming a plurality of controllable delay elements, each controllable delay element associated with a respective optical guide; and
    coupling a controller to the plurality of controllable delay elements.

20. The method of claim 19 wherein each controllable delay element is associated with the lateral path direction of the respective optical guide.

21. The method of claim 19 wherein each optical guide comprises at least one of an optical mirror and an optical grating.

22. The method of claim 19 comprising forming a plurality of re-emission elements on the substrate downstream from the plurality of controllable delay elements, each re-emission element associated with a respective optical guide.

23. The method of claim 19 comprising forming a plurality of optical detectors on the substrate.

24. The method of claim 19 comprising forming a plurality of phase correction elements, each phase correction element associated with a respective optical guide.

25. The method of claim 19 wherein the plurality of VCSELs are operable at a wavelength in a range of 390 nm to 510 nm.

* * * * *